United States Patent [19]

Lemaire

[11] Patent Number: 4,709,217
[45] Date of Patent: Nov. 24, 1987

[54] DIFFERENTIAL CURRENT AMPLIFIER
[75] Inventor: Frederic Lemaire, St. Egreve, France
[73] Assignee: Thomson-CSF, Paris, France
[21] Appl. No.: 825,644
[22] Filed: Feb. 3, 1986
[30] Foreign Application Priority Data
  Feb. 5, 1985 [FR] France ................ 85 01585
[51] Int. Cl.$^4$ ............................................. H03F 3/45
[52] U.S. Cl. ..................................... 330/258; 330/51; 330/69
[58] Field of Search ................. 330/9, 10, 51, 69, 258; 307/355; 328/162

[56] References Cited

U.S. PATENT DOCUMENTS 4,138,649 2/1979 Schaffer ................................. 330/9
4,392,112 7/1983 Schade, Jr. ........................ 330/252

FOREIGN PATENT DOCUMENTS 0039076 11/1981 European Pat. Off. .
2201707 7/1973 Fed. Rep. of Germany .......... 330/9
3304814 8/1984 Fed. Rep. of Germany .

OTHER PUBLICATIONS

Journal of Physics E: Scientific Instruments, vol. 17, No. 6, juin 1984, pp. 472-476, The Institute of Physics Dorking GM; D. J. Mapps, et al.: "Magnetostriction Harmonics Measurement using a Double Piezoelectcic Transducer Technique.
Electronics, vol. 41, No. 9, 29 Avril 1968, pp. 58-64, New York, U.S.; R. I. Demrow: "Protecting Data from the Ground Up".

Primary Examiner—James B. Mullins
Attorney, Agent, or Firm—Oblon, Fisher, Spivak, McClelland, & Maier

[57] ABSTRACT

The invention relates to differential current amplifiers. In order to obtain amplification of a difference between two currents I1 and I2 with good common mode rejection, the currents I1 and I2 are caused to pass alternately through two equal resistors R1 and R2 and the differential voltage drop across R1 and across R2 is amplified by a voltage amplifier.

4 Claims, 5 Drawing Figures

DIFFERENTIAL CURRENT AMPLIFIER

BACKGROUND OF THE INVENTION

The present invention relates to differential current amplifiers, namely amplifiers capable of receiving a current I1 at a first input terminal and a current I2 at a second input terminal so as to produce at the output a current proportional to I1−I2.

It is known to construct this type of amplifier for example using a diagram such as the one shown in FIG. 1: the current I1 is applied to a resistor R1 and the current I2 to a resistor R2 of the same value as R1. The difference of the voltage drops R1I1 and R2I2 across these resistors is measured by a differential voltage amplifer 18. It is known how to construct voltage amplifiers having good rejection of the common mode. The output voltage of the amplifier is proportional to R1I1−R2I2.

If R1 is equal to R2 there is no problem. But in practice it is difficult to produce sufficiently accurate resistors, particularly if the current amplifier is to be constructed in the form of an integrated circuit. In the output signal there will appear a common mode component due to the difference in value of the resistors (component proportional to the mean value of the currents and to the difference R1−R2).

The accuracy is therefore directly linked to the pairing of the resistors.

SUMMARY OF THE INVENTION

For that, the invention provides a differential current amplifier having two inputs each receiving a respective input current, so as to produce at the output a signal proportional to the difference of the input currents, comprising two resistors connected to the same circuit node and having substantially the same value, connections between the inputs of the current amplifier and the resistors and a means for forming across resistor R1 a voltage drop varying as the product R1I1 and across the resistor R2 a voltage drop varying as R2I2, the resistors being further each connected to an input of a differential voltage amplifier, wherein periodic switching means are provided actuated with a cyclic ratio close to 0.5 for:

(1) inverting the connections between the inputs of the current amplifier and the resistors during half of each switching cycle, so as to produce during this half cycle a voltage drop varying as R1I2 across resistor R1 and a voltage drop varying as R2I1 across resistor R2, (2) also inverting the connections between the resistors and the inputs of the amplifier during this half cycle.

By voltage drop varying "as R1I1" (or R1I2 or R2I2 or R2I1), is meant more particularly a voltage drop R1I1 or −R1I1, but also R1 (Io+I1) where Io is a constant, or else R1(Io−I1)etc . . . , the essential thing being that two voltage drops may be readily established (for example R1(Io−I1) and R1 (Io−I2), whose difference, here R1(I1−I2), amounts to a value proportional to I1−I2.

BRIEF DESCRIPTION OF THE DRAWINGS

Other features and advantages of the invention will be clear from the following detailed description with reference to the accompanying drawings in which.

DESCRIPTION OF THE PREFERRED EMBODIMENTS

Figure 1:
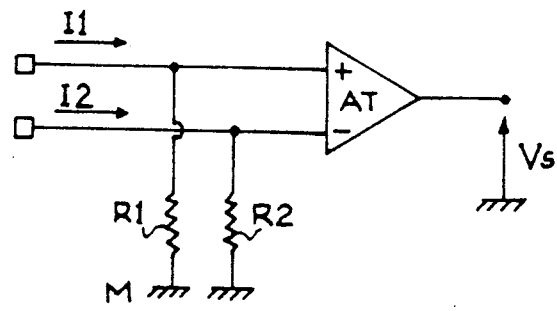
FIG. 1 already mentioned shows the prior technique.
Figure 2:
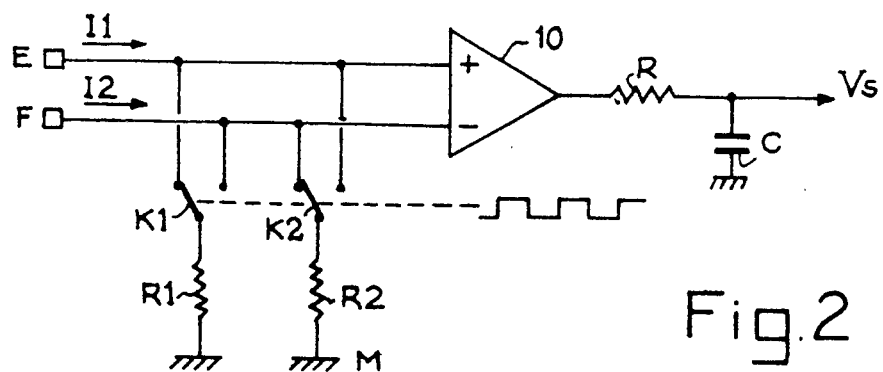
FIG. 2 shows a general circuit diagram of a current amplifier.

The differential current amplifier shown in FIG. 2, comprises two input terminals E and F.

The terminals E and F are connected to the inputs of a differential voltage amplifier 10 having a high input impedance and having good common mode rejection (which can be easily provided for a *voltage* differential amplifier).

Two resistors R1 and R2 connected on one side to the same circuit node which may be a ground M, are connected on the other side, one (R1) to a first switch K1 and the other (R2) to a second switch K2. The switches are actuated periodically in phase with each other with a cyclic switching ratio close to 0.5, that is to say that they are in a first state during a first half period of the switching frequency and in a second state during the following half period.

The dual switch K1 allows resistor R1 to be connected either to terminal E or to terminal F.

The dual switch K2 allows resistor R2 to be connected either to terminal F or to terminal E.

When resistor R1 is connected to terminal E, resistor R2 is connected to terminal F and vice versa.

An input current I1 is injected through terminal E and another input current I2 is injected through terminal F.

The differential voltage amplifier has for example unitary gain (for the sake of simplicity).

In this case, it produces at its output a voltage which is R1I1−R2I2 during the first half period and R2I1−−R1I2 during the next half period.

To analyse the mean current I1−I2, a low pass filter RC is placed at the output of the voltage amplifier which smoothes the variations due to the switching. The mean voltage at the terminals of the capacitor is then $$\left(\frac{R1 + R2}{2}\right)$$

(I1−I2).

Even if R1 and R2 are not equal there is not (in the first order) any common mode component due to the difference in value of the resistors.

Care will however be taken to make the values R1 and R2 as equal as possible so as to avoid a common mode component which might be due for example to a cyclic switching ratio not equal to 0.5. Thus, there is clearly purely differential amplification of the currents I1 and I2, the common mode components only existing in the second order.

If currents I1 and I2 are alternating, the switching frequency of the switches will be chosen higher than the frequency of the signals I1 and I2.

In certain very special cases, smoothing of the output voltage of the voltage amplifier by means of an RC filter may not be required.

For example, that may occur when the input currents I1 and I2 are alternating, when they have the same known frequency f and when switching of switches K1 and K2 takes place precisely at the frequency f, for example in order to detect a DC component in the AC signal I1−I2: in this case the output voltage of the voltage amplifier may be converted into a current and this current may be applied to a capacitor; then the voltage at the terminals thereof is sampled at frequency f. The increase or decrease of this sampled voltage is a measurement of the DC component of the difference of currents I1 and I2.

Figure 3:
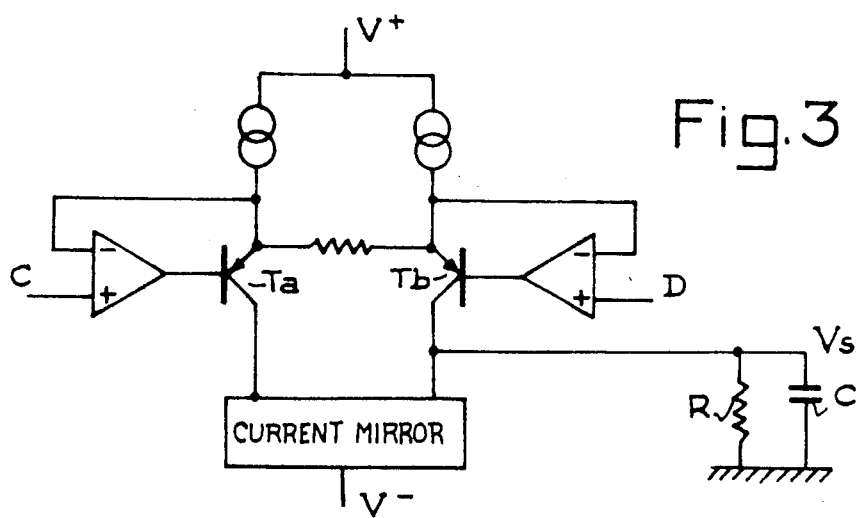
FIG. 3 shows by way of example only a voltage differential amplifier.

FIG. 3 shows only by way of example a voltage amplifier structure with good common mode rejection which may be used in the diagram of FIG. 2. It comprises a differential output stage with two transistors Ta and Tb through which equal currents flow in the absence of an input signal and through which different currents flow in the presence of an input signal, the difference between the currents being proportional to the signal and being applied to an RC parallel network connected to the collector of one of the transistors. The voltages at the terminals of this network forms the output voltage of the amplifier and does not need to be filtered by another RC network. The inputs of this voltage amplifier are the bases of transistors Ta and Tb, each preceded if need be by another differential stage with high input impedance, one of the inputs of this other stage being relooped to the emitter of the transistor Ta (or Tb).

Figure 4:
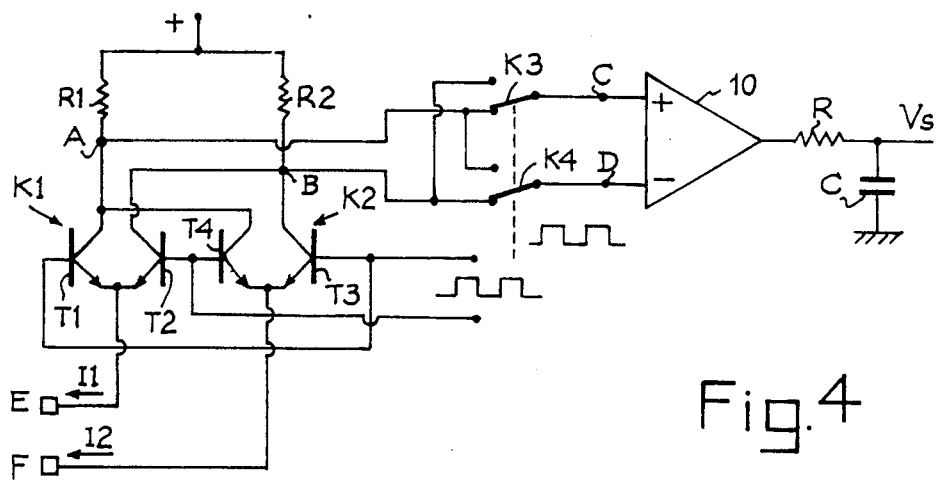
FIG. 4 shows a particular circuit diagram for the differential amplification of currents leaving the input terminals.

FIG. 4 shows a concrete example of construction of the current amplifier.

In this example, instead of the input terminals E and F receiving the currents I1 and I2 (outgoing currents in this case) being directly connected to the inputs of the voltage amplifier, they are connected to these inputs through two groups of switches.

The first group comprises a switch K1 and a switch K2. Switch K1 comprises a transistor T1 connected to the terminal E and the resistor R1 and a transistor T2 connected between terminal E and resistor R2. Switch K2 comprises a transistor T4 connected between the terminal F and resistor R1 and the transistor T3 connected between the terminal F and the resistor R2. The transistors T1 and T3 are enabled for a half period of the switching frequency of the switches and disabled during the other half period. The transistors T2 and T4 are enabled and disabled in phase opposition with transistors T1 and T3.

The resistors R1 and R2 are further connected to the same circuit node.

The second group of switches comprises a switch K3 and a switch K4 actuated at the same switching frequency. Switch K3 connects an input C of the differential voltage amplifier either to the junction point A between resistor R1 and transistors T1 and T4 during the first half period where T1 and T3 are enabled or to the junction point B between resistor R2 and transistors T2 and T3 during the half period where T2 and T4 are enabled.

Switch K4 connects the other input D of the differential voltage amplifier either to the junction point A while T2 and T4 are enabled or to point B while T1 and T3 are enabled.

The mean difference of the voltage drops across R1 and R2 is the same as in FIG. 2.

Figure 5:
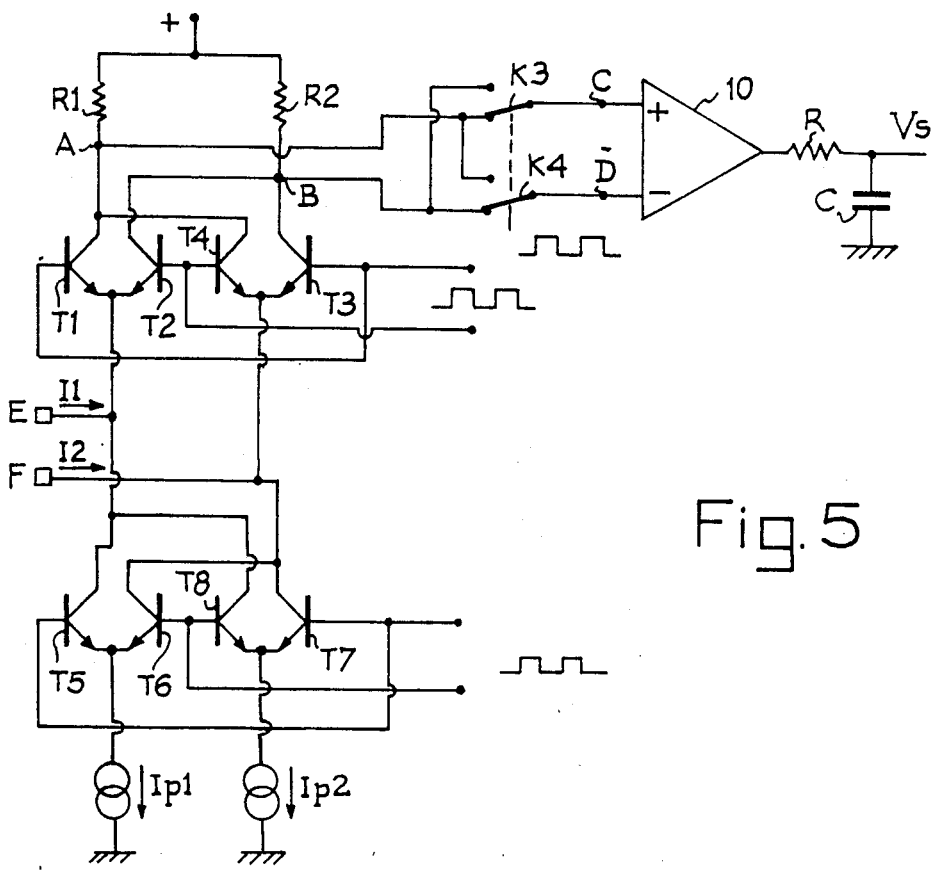
FIG. 5 shows a particular circuit diagram for the differential amplification of currents coming into or leaving the input terminals.

In another variant shown in FIG. 5, the diagram of FIG. 4 is kept as a whole to which the following elements are added: the terminal E is connected to a transistor T5 and to a transistor T8. Transistor T5 is connected between the terminal E and a current source Ip1; transistor T8 is connected between terminal E and a current source Ip2. The terminal F is connected to a transistor T6 and a transistor T7. Transistor T6 is connected between terminal F and the current source Ip1; transistor T7 is connected between terminal F and the current source Ip2.

Transistors T5 and T7 are enabled and disabled in phase with the transistors T1 and T3; transistors T6 and T8 in phase with the transistors T2 and T4.

Thus, resistor R1 has a current Ip1−I1 flowing therethrough during a half period and a current Ip1−I2 during the next half period.

Conversely, resistor R2 has first of all a current Ip2−I2 (first half period) flowing therethrough then the current Ip2−I1.

The difference in the voltage drops across R1 and across R2 is therefore first of all R2(Ip2−I2)−R1(Ip1−I1) then R2(Ip2−I1)−R1(Ip1−I2), but this latter value is inverted at the terminals of the voltage amplifier during the second half period (by switches K3 and K4).

On average, the differential voltage at the input terminals of the voltage amplifier is therefore equal to:

$$\tfrac{1}{2}(R2(Ip2-I2)-R1(Ip1-I1)+R1(Ip-I2)-R2(Ip2-I1)) \text{ that is } \tfrac{1}{2}(R1+R2)(I1-I2)$$

Here again, the error in equality of resistors R1 and R2 does not intervene in the first order. The same goes for the error in equality of currents Ip1 and Ip2 which are however preferably chosen equal.

Common mode rejection is hereagain only limited by the performances of the voltage amplifier if the resistors R1 and R2, the currents Ip1 and Ip2 and the half periods of the switching cycle are paired as well as possible.

What is claimed is:

1. In a differential current amplifier having two inputs each receiving a respective input current I1 and I2, so as to produce at the output a signal proportional to the difference of the input currents, comprising a differential voltage amplifer having two inputs, two resistors connected to the same circuit node and having substantially the same value, periodic switching means are provided, actuated with a cyclic ratio close to 0.5 for
    (1) during a first half of each cycle, connecting the resistors to the inputs of the differential current amplifier so as to produce across the first resistor R1 a voltage drop varying as R1I1 and across the second resistor R2 a voltage drop varying as R2I2, and connecting the first resistor R1 to a first input of the differential voltage amplifier and the second resistor to a second input of the differential voltage amplifier,
    (2) during a second half of each cycle reversing the connections between the resistors and the inputs of the differential current amplifier so as to produce across the first resistor R1 a voltage drop varying as R1I2 and across the second resistor R2 a voltage drop varying as R2I1, and also reversing the connections between the resistors and the inputs of the differential voltage amplifier.

2. The differential current amplifier as claimed in claim 1, wherein the connections between the resistors and the inputs of the differential current amplifer are such that the current circulating through R1 and R2 are respectively the input currents I1 and I2 during the first half-cycle and are the input currents I2 and I1 respectively during the second half-cycle.

3. The differential current amplifier as claimed in claim 1 further comprising means for substracting from each input current a current having a fixed value so that the voltage drop across a resistor is the product between the value of this resistor and the difference between an input current and said fixed value.

4. The differential current amplifier as claimed in any one of claim 1 to 3, wherein said first resistor is connected to a first transistor and to a second transistor connected respectively to the first input and the second input of the current amplifier, said second resistor is connected to a third transistor and a fourth transistor connected respectively to the first and the second inputs of the current amplifier, said periodic switching means including a dual switch, the resistors being further connected through said dual switch to the inputs of the voltage amplifier, the transistors and the switch being switched periodically in phase alternation with a cyclic ratio close the 0.5, the first and fourth transistors being disabled for a first half of the periodic cycle and enabled during the second half and conversely the second and third transistors being enabled during the first half and disabled during the second half, the dual switch reversing the connections between the resistors and the inputs of the amplifier at each period.

* * * * *